United States Patent [19]
Ichiyama

[11] Patent Number: 5,373,190
[45] Date of Patent: Dec. 13, 1994

[54] RESIN-SEALED SEMICONDUCTOR DEVICE

[75] Inventor: Hideyuki Ichiyama, Itami, Japan

[73] Assignee: Mitsubishi Denki Kabushiki Kaisha, Tokyo, Japan

[21] Appl. No.: 842,496

[22] Filed: Feb. 27, 1992

[30] Foreign Application Priority Data

Aug. 12, 1991 [JP] Japan .................. 3-201965

[51] Int. Cl.⁵ ........................... H01L 23/28
[52] U.S. Cl. ...................... 257/737; 257/778; 257/787
[58] Field of Search ............ 257/787, 788, 778, 737

[56] References Cited

U.S. PATENT DOCUMENTS

| | | | |
|---|---|---|---|
| 3,922,712 | 11/1975 | Stryker | 257/778 |
| 3,959,874 | 6/1976 | Coucoulas | 257/787 |
| 3,972,062 | 7/1976 | Hopp | 257/778 |
| 4,839,713 | 6/1989 | Teraoka et al. | 257/787 |
| 5,019,673 | 5/1991 | Juskey et al. | 174/52.2 |

FOREIGN PATENT DOCUMENTS

| | | |
|---|---|---|
| 53-10272 | 1/1978 | Japan . |
| 58-48947 | 3/1983 | Japan . |
| 61-220346 | 9/1986 | Japan . |
| 63-308329 | 12/1988 | Japan . |
| 249460 | 2/1990 | Japan . |
| 42152 | 1/1992 | Japan . |
| 7606781 | 12/1976 | Netherlands . |

*Primary Examiner*—Rolf Hille
*Assistant Examiner*—Roy Potter
*Attorney, Agent, or Firm*—Leydig, Voit & Mayer

[57] ABSTRACT

A resin-sealed semiconductor device includes and has a size that is substantially the same as a semiconductor element. The semiconductor device is easily handled and highly reliable. First ends of terminals made of a conductor, such as copper or the like, are respectively electrically connected to corresponding electrodes of the semiconductor element. The semiconductor element is sealed with a sealing resin so that second ends of the terminals are exposed at the surface of the sealing resin. Since the terminals are strong and are not easily damaged, there are no voids and a highly reliable semiconductor device is achieved.

1 Claim, 7 Drawing Sheets

RESIN-SEALED SEMICONDUCTOR DEVICE

BACKGROUND OF THE INVENTION

1. Field of the Invention

The present invention relates to a resin-sealed semiconductor device, and particularly to a resin-sealed semiconductor device which is easy to handle and has a package structure with high reliability.

2. Description of Related Art

FIG. 11 is a partially broken-away perspective view showing a conventional resin-sealed semiconductor device 1a. In the drawing, a semiconductor element 1 having a integrated circuit or the like formed on the surface of a semiconductor wafer such as silicon or the like is mounted on a substrate 2 and secured thereto by an adhesive layer 3. Electrodes (not shown) on the semiconductor element 1 are connected to inner leads 6 by bonding wires 7. The semiconductor element 1 and the inner leads 6 are covered with a sealing resin 4, while outer leads 5 connected to the inner leads 6 project to outside of the sealing resin 4.

In the conventional resin-sealed semiconductor device 1a configured as described above, the semiconductor element 1 is connected to the outer leads 5 through the bonding wires 7 and the inner leads 6 so that electrical signals are input and output through the outer leads 5 when the semiconductor device 1a is used.

In the above resin-sealed semiconductor device 1a, the inner leads 6 must be connected to the semiconductor element 1. There is thus the need for some distance between the semiconductor element 1 and each of the inner leads 6 from the viewpoint of the characteristics of metal wires such as a gold (Au), copper (Cu), aluminum (Al) wire or the like, which is used as the bonding wires 7. In addition, the length of each of the inner leads 6 must be secured for preventing the outer leads 5 and the inner leads 6 from slipping off the sealing resin 4 during forming (bending) of the outer leads 5. The size of the resin-sealed semiconductor device 1a is thus significantly increased, as compared with that of the semiconductor element 1. The conventional semiconductor device thus has the problem that it is difficult to reduce the size, weight and thickness thereof.

On the other hand, mounting a semiconductor element by the flip chip method, as shown in FIG. 12, has the possibility that the semiconductor element 1 is damaged during mounting because a bare chip, i.e., the semiconductor element 1, is handled to place it on a substrate 11 for mounting. The method also requires the step of covering the whole element with a potting resin (not shown) or the like after the electrodes 8 of the semiconductor element 1 are mounted on lands 9 of the substrate 11, with bumps 10 therebetween. The method thus has the problem that the resin sealing work is further required before or after the usual reflowing step.

The conventional bumps 10 also have the problems that it is difficult to make the height uniform and voids easily occur in the bumps 10, that the bumps 10 are easily damaged due to their low strength because they are made of solder, gold or the like. There is the great possibility that the bumps 10 will become separated after mounting on the substrate because the bumps 10 have low shear strength.

SUMMARY OF THE INVENTION

The present invention has been achieved for solving the above problems, and it is an object of the invention to provide a resin-sealed semiconductor device which has substantially the same size as that of a semiconductor element and which is easy to handle.

To this end, the present invention provides a resin-sealed semiconductor device comprising a semiconductor element provided with electrodes, a sealing resin for sealing the semiconductor element and terminals which have first ends respectively electrically connected to the electrodes and second ends exposed at the surface of the sealing resin.

In the present invention, since the terminals which are respectively electrically connected to the electrodes of the semiconductor element and which are exposed at the sealing resin function as outer leads, there is no need for space for bonding wires. In addition, resin sealing permits the semiconductor device to be easily handled and mounted on a substrate with the same techniques ordinarily used for mounting parts.

DETAILED DESCRIPTION OF PREFERRED EMBODIMENTS

Figure 1:
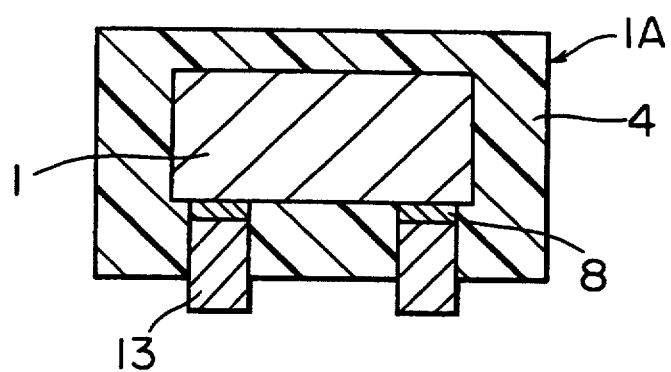
FIG. 1 is a sectional view of a resin-sealed semiconductor device according to an embodiment of the present invention.
Figure 2:
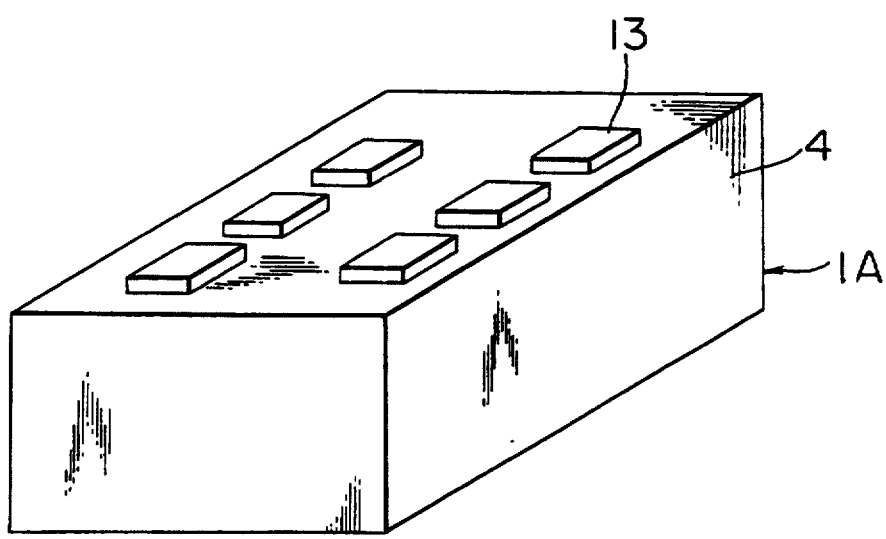
FIG. 2 is a perspective view of the resin-sealed semiconductor device shown in FIG. 1.

FIG. 1 is a sectional view of a resin-sealed semiconductor device 1A according to an embodiment of the present invention, and FIG. 2 is a perspective of the same. In the drawings, the same reference numerals denote the same or equivalent portions. In the drawings, first ends of terminals 13 made of a conductor such as copper or the like are respectively electrically connected to electrodes 8 of a semiconductor element 1. Although the semiconductor element 1 is sealed with a sealing resin 4, the second ends of the terminals 13 are exposed at the surface of the sealing resin 4. Since the terminals 13 are made of a conductor having higher strength than that of the bumps 10, the terminals are not easily damaged, and no void occurs therein. The length of each of the terminals 13 can be adjusted by cutting or grinding the end of each terminal 13 through a spacer (not shown) after the terminals 13 have been connected to the electrodes and sealed with resin.

Figure 3:
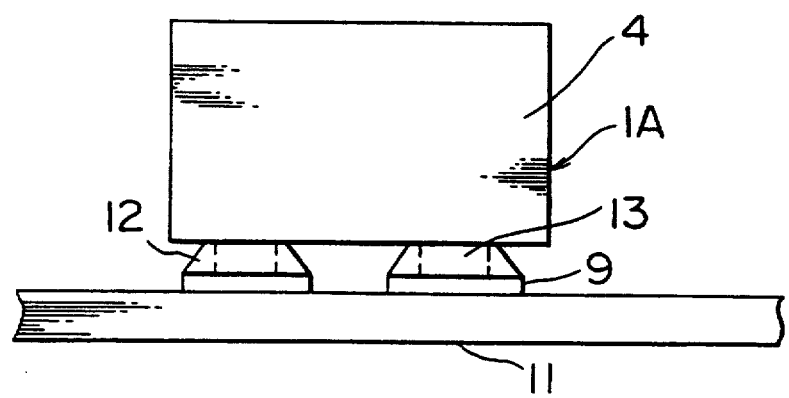
FIG. 3 is a schematic side view showing a resin-sealed semiconductor device mounted on a substrate.

The resin-sealed semiconductor device 1A configured as described above permits mounting on a substrate by the same operation as that for usual substrate mounting. Namely, as shown in FIG. 3, solder paste 12 is applied to lands 9 on the substrate 11, and the resin-sealed semiconductor device 1A is mounted so that the terminals 13 are mounted on the lands 9, followed by reflowing or the like to complete mounting.

Figure 4:
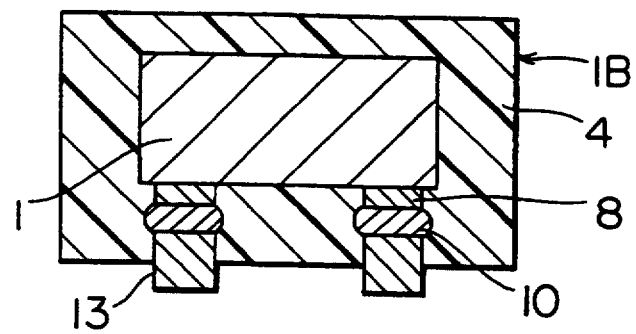
FIG. 4 is a sectional view of a resin-sealed semiconductor device having the bumps respectively provided between electrodes and terminals.

Although the above embodiment includes terminals directly electrically connected to the electrodes of the semiconductor element 1, bumps 10 may be respectively interposed between the electrodes 8 and the terminals 13 of a resin-sealed semiconductor device 1B, as shown in FIG. 4. In this case, the heights of the terminals 13 can be easily made uniform because variations in the height of the terminals 13 can be absorbed by the bumps 10 having low strength. Namely, the exposed end of each of the terminals 13 is pressed against the surface of a planar board or the like, and the bumps 10 are respectively connected to the terminals 13 so that variations in length of the terminals 13 can be absorbed by the relatively soft bumps 10.

Figure 5:
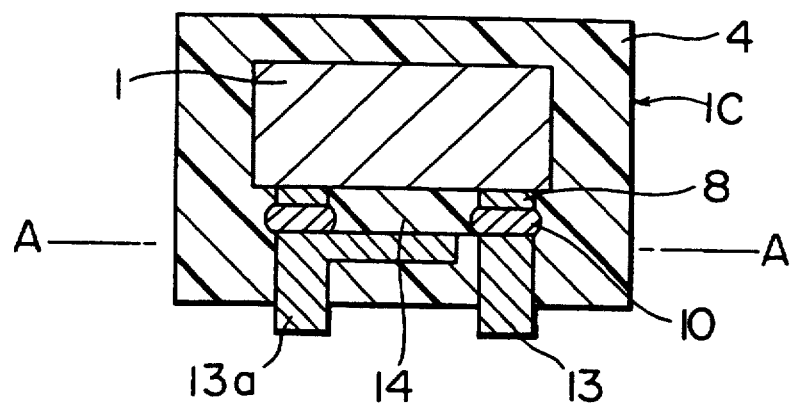
FIG. 5 is a sectional view of a resin-sealed semiconductor device having a terminal having one end extended to the surface of a semiconductor element through an insulator.
Figure 6:
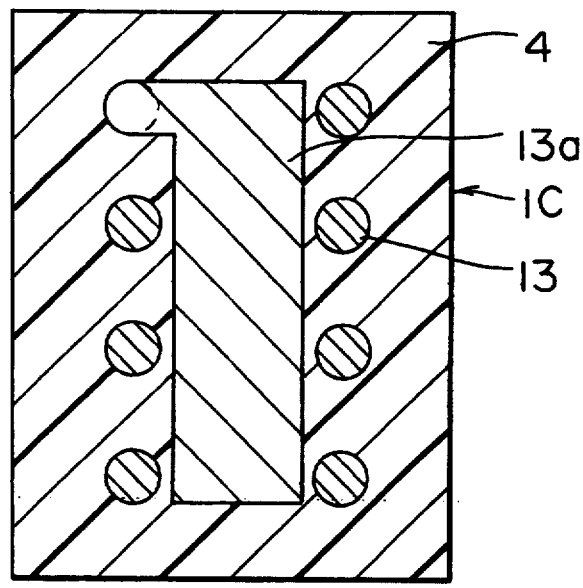
FIG. 6 is a sectional view taken along the line A—A of the resin-sealed semiconductor device shown in FIG. 5.

As shown in FIG. 5, one end of a terminal 13a, which is not exposed at the surface of the sealing resin 4, may also be extended to the surface of the semiconductor element 1 through an insulator 14. FIG. 6 is a sectional view taken along the line A—A of the resin-sealed semiconductor device 1C shown in FIG. 5. This arrangement significantly decreases the inductance of a package and decreases noise and thus can make contribution to the high-speed operation of the element. In this case, the use of a good conductor such as copper material for the terminals 13 is more effective. A resin such as polyimide or the like, an epoxy resin or the sealing resin 4 can be used as the insulator 14. Although FIG. 5 shows an embodiment in which the bumps 10 are included, each of the electrodes 8 may be brought into direct contact with the terminal 13 or 13a, without providing the bumps 10.

Figure 7:
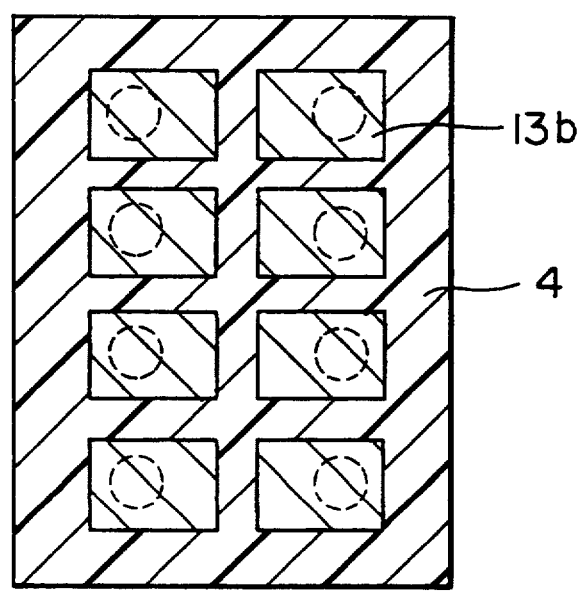
FIG. 7 is a sectional view of a resin-sealed semiconductor device having terminals each of which has one end extended to the surface of a semiconductor element.

The shape of the terminal 13a shown in FIG. 6 may be changed to the shape shown in FIG. 7 in which each of terminals 13b is extended.

Figure 8:
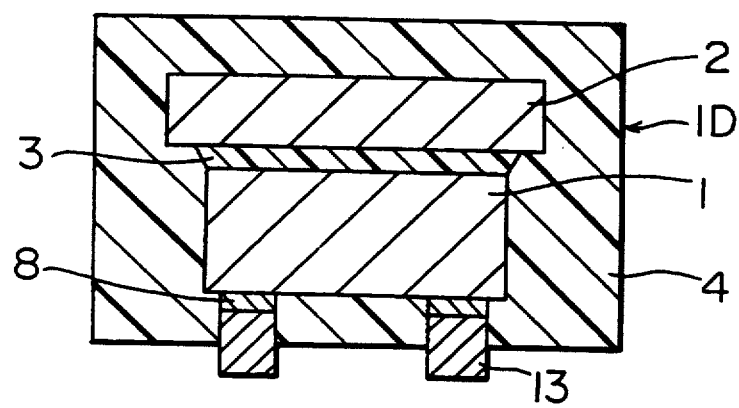
FIG. 8 is a sectional view of a resin-sealed semiconductor device having a semiconductor element secured to a base.
Figure 9:
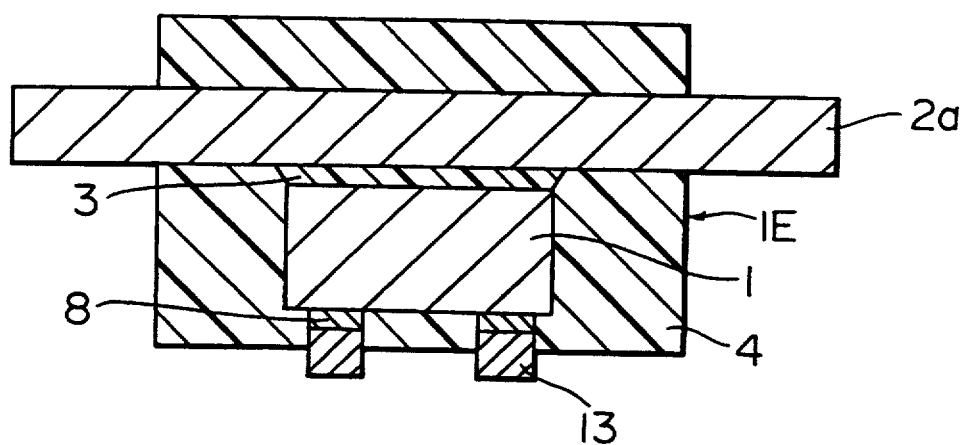
FIG. 9 is a sectional view of a resin-sealed semiconductor device having a base projecting from a sealing resin.
Figure 10:
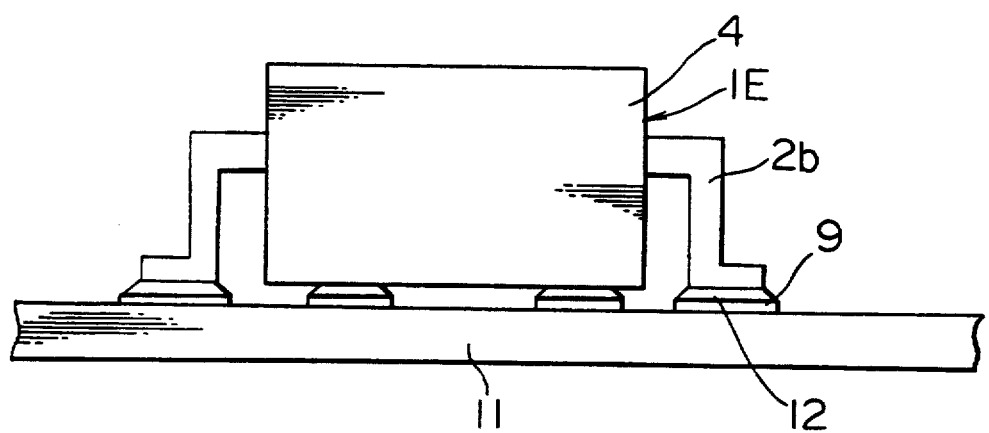
FIG. 10 is a schematic side view of a resin-sealed semiconductor device having a base mounted on a substrate.
Figure 11:
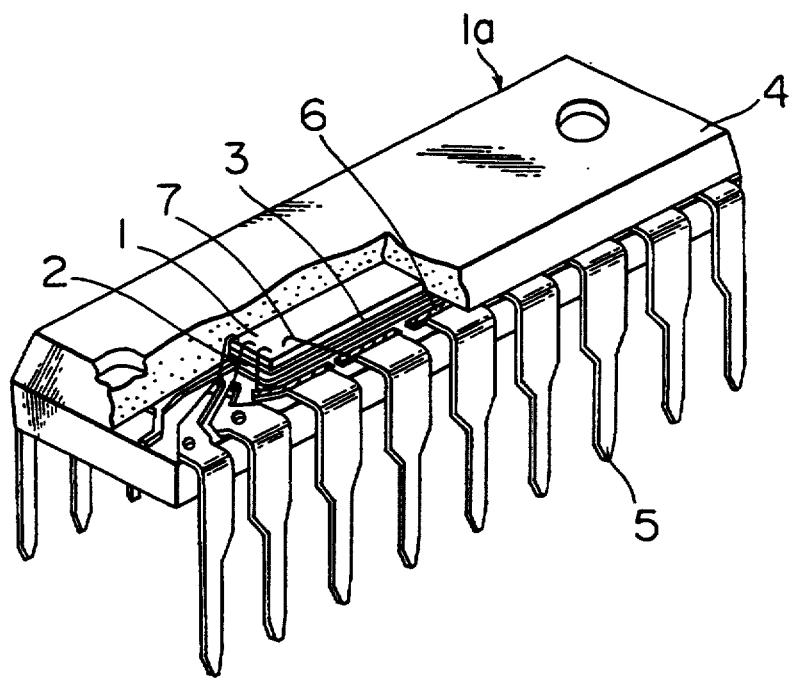
FIG. 11 is a partially broken away perspective view of a conventional resin-sealed semiconductor device.
Figure 12:
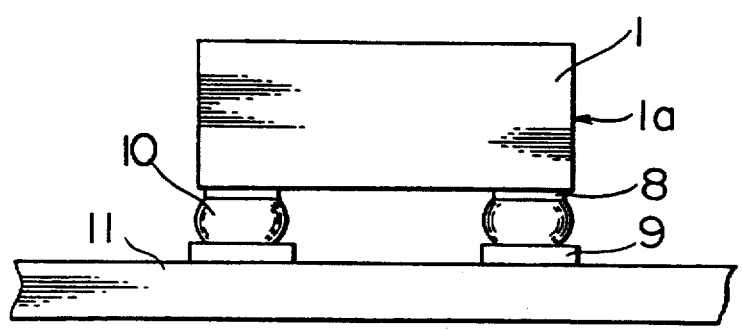
FIG. 12 is a schematic side view showing a conventional resin-sealed semiconductor device mounted on a substrate.

Each of the above embodiments concerns the case where the semiconductor element 1 itself is encapsulated with the sealing resin 4, the semiconductor element 1 may be secured to a base material 2 and sealed with resin together with the base material 2 to form a resin-sealed semiconductor device 1D, as shown in FIG. 8. When the semiconductor element 1 generates a large quantity of heat, a base material 2a may project from the sealing resin 4 so that a resin-sealed semiconductor device 1E having improved radiation properties can be obtained, as shown in FIG. 9. In addition, when the rear side of the semiconductor element 1 is used as ground, a base material 2b projecting from the sealing resin 4 is bent and mounted on a substrate 11, as shown in FIG. 10.

As described above, the present invention is capable of producing a very compact and thin resin-sealed semiconductor device without using any inner leads and bonding wires. The invention can also use a conventional technique in the mounting process and has the effect of producing a resin-sealed semiconductor device having the high reliability of resin-sealed semiconductor devices. In addition, since one end of a terminal is extended to the surface of a semiconductor element through an insulator, the inductance of the package is significantly decreased, and noise is also decreased. This can make contribution to the high-speed operation of the element. Further, since bumps are respectively interposed between electrodes and ends of terminals, variations in the heights of the terminals can be observed, and thus the heights of the terminals can easily be made uniform.

What is claimed is:

1. A resin-encapsulated semiconductor device comprising:

a semiconductor element including a plurality of electrodes;

electrically conductive bumps disposed on respective electrodes;

a plurality of terminals respectively having first and second ends, the first ends of said terminals directly contacting respective bumps, at least one of said terminals including a transverse extension proximate the first end of said terminal and including an insulating body disposed between said semiconductor chip and said transverse extension; and a resin encapsulating said semiconductor elements, said bumps, and the first ends of said terminals, said resin having an outside surface, the second ends of said terminals being disposed at the outside surface of said resin.

* * * * *